United States Patent [19]
Scott

[11] Patent Number: 5,552,724
[45] Date of Patent: Sep. 3, 1996

[54] POWER-DOWN REFERENCE CIRCUIT FOR ECL GATE CIRCUITRY

[75] Inventor: David B. Scott, Plano, Tex.

[73] Assignee: Texas Instruments Incorporated, Dallas, Tex.

[21] Appl. No.: 122,273

[22] Filed: Sep. 17, 1993

[51] Int. Cl.$^6$ .................................................. H03K 19/086
[52] U.S. Cl. ............................................ 326/126; 327/542
[58] Field of Search ...................................... 307/473, 446, 307/570, 455; 326/126, 127, 110; 327/542

[56] References Cited

U.S. PATENT DOCUMENTS

| | | | |
|---|---|---|---|
| 4,450,366 | 5/1984 | Malhi et al. | 327/542 |
| 4,926,069 | 5/1990 | Yamazaki | 307/570 |
| 5,095,229 | 3/1992 | Yun et al. | 307/570 |
| 5,132,569 | 7/1992 | Matsuda | 307/475 |
| 5,276,364 | 1/1994 | Wellheuser | 307/473 |
| 5,281,873 | 1/1994 | Seki | 307/570 |

*Primary Examiner*—Edward P. Westin
*Assistant Examiner*—Benjamin D. Driscoll
*Attorney, Agent, or Firm*—Mark A. Valetti; W. James Brady III; Richard L. Donaldson

[57] ABSTRACT

Local reference voltage sub-circuits for ECL circuits are provided. The sub-circuits operate by a principal based on gating a current mirror. The sub-circuits described are superior to conventional approaches because less current is required during switching, better transfer characteristics are obtained and there exists, in some cases, less susceptibility to latch-up in comparison with conventional approaches.

13 Claims, 7 Drawing Sheets

POWER-DOWN REFERENCE CIRCUIT FOR ECL GATE CIRCUITRY

BACKGROUND OF THE INVENTION

Emitter-coupled logic (ECL) circuits require a reference voltage which is used to set the amount of current going through each of the ECL gates. One reference voltage source is used to supply a reference voltage for numerous ECL circuits. Typically, this scheme works well except when the voltage drops along the power supply lines of the circuit cause the reference voltage to become invalid. The voltage drops are manifested by voltage drops along the lower-voltage power supply rail due to series resistance along the path between the reference voltage source and a particular ECL circuit. Another problem with conventional ECL gates is their need for a supply voltage of a large magnitude. Consequently, conventional ECL circuits are not well suited for use with the ever decreasing power supply voltages associated with tomorrow's circuits, particularly, 3.3 volts and below. ECL circuits which provide a reference voltage source local to each ECL circuit solves the above problem. A local reference voltage circuit is provided for each ECL circuit of a plurality of ECL circuits. In addition, CMOS logic can be used to provide for a low power standby mode when the ECL gates are not in use. A need exists to provide an ECL circuit with improved operating characteristics which additionally possesses a low power standby mode.

FIG. 1a illustrates a schematic drawing of prior art ECL circuit 1 implementing a logic OR gate. Local reference sub-circuit 3 provides a local reference voltage for ECL circuit 1 as well as provides enabling of circuit 1 through circuit enable input EN. Local reference sub-circuit 3 further comprises first inverter 9 and second inverter 10. First inverter 9 includes p-channel field effect transistor 2 and n-channel field effect transistor 4. Second inverter 10 includes p-channel field effect transistor 11 and n-channel field effect transistor 6. For low power output applications, transistor 11 typically has a gate width of 60 microns (µm). For high performance applications (greater power), the gate width of transistor 11 is on the order of 180 µm. A logic high enable signal at enable input EN enables local reference sub-circuit 3 as well as the remainder of circuit 1. Within sub-circuit 3, the local reference voltage for the circuit 1 is measured from the base of n-type bipolar transistor 8, connected to and between resistors 5 and 7, and circuit ground. For low power output applications, transistor 8 typically has an emitter area substantially equal to 1.2 µm² and transistor 8 is fabricated as a single-sided base transistor. The value of the local reference current (which is output from local reference sub-circuit 3 at output REF) generated by local reference sub-circuit 3 is determined substantially by the emitter and collector currents through transistor 8 which are primarily determined by the voltage drop across resistor 5. To ensure that the emitter and collector currents through transistor 8 are primarily determined by the voltage drop across resistor 5, the gate width of transistor 6 is made as wide as possible. This prevents transistor 6 from playing a major role in setting the current level of the current through the emitter and collector of transistor 8. The inverter formed by transistor 2 and transistor 8 ensures that the trip point of local reference sub-circuit 3 is midway between circuit power supply voltage Vcc and circuit ground. This trip point leads to improved noise margin.

The remainder of the circuit of FIG. 1a apart from the local reference sub-circuit 3 is constructed as follows. Bipolar transistors 12 and 14 with load resistors 13 and 15 respectively, form an emitter-coupled pair wherein the their emitters are connected to the collector of bipolar transistor 16. Bipolar transistor 16 has its base connected to the base of transistor 8 and the emitter of transistor 16 is connected to emitter resistor 17 which is connected to circuit ground. Bipolar transistors 18 and 20 with load resistors 19 and 21 respectively, form an emitter-coupled pair wherein the their emitters are connected to the collector of bipolar transistor 22. Bipolar transistor 22 forms an emitter coupled pair with bipolar transistor 24. The emitters of transistors 22 and 24 are connected to the collector of transistor 26. Transistor 24 has its collector connected to the collector of transistor 19. The emitter of transistor 26 is connected to emitter resistor 23 which is connected to circuit ground. The base of transistor 26 is connected to the bases of transistors 8 and 16. Bipolar transistor 28 has its base connected to the collector of transistor 21 and bipolar transistor 30 has its base connected to the collector of bipolar transistor 19. Circuit output OUT is taken from the emitter of transistor 28 and circuit output $\overline{OUT}$ is taken from the emitter of transistor 30. Bipolar transistor 32 is connected to the emitter of transistor 28 at its collector and bipolar transistor 32 is connected to the bases of transistors 8, 16, and 26 at its base. Bipolar transistor 34 is connected to transistor 30's emitter at its collector. The base of transistor 34 is connected to the base of transistor 32. The emitters of transistors 32 and 34 are connected to their emitter resistors, resistors 32 and 34, respectively. The base of transistor 12 serves as the input for input A while the base of transistor 14 serves as the input for input $\overline{A}$. The base of transistor 22 serves as the input for input $\overline{B}$ while the base of transistor 24 serves as the input for input B.

In principal, the collector and emitter currents through transistor 8 are mirrored through n-type bipolar transistors 16, 26, 32 and 34. Transistors 12, 14 and 16 comprises a first current mirror. Transistors 18, 20, 22, 24 and 26 comprise a second current mirror. Transistors 28, 30, 32 and 34 comprise a third current mirror. For power down, ECL gates connected to local reference sub-circuit 3 can be turned off by turning off transistor 8. For instance, ECL bipolar transistor pairs comprising transistors 12 and 14, 18 and 20 and 22 and 24 are turned off when transistor 8 is shut off. Note that the remainder of the circuit in FIG. 1a comprises collector resistors 13, 15, 19 and 21 and emitter resistors 17, 23 25 and 27.

FIG. 1b illustrates a block diagram drawing of the local reference sub-circuit scheme wherein a local reference sub-circuit is connected to several current mirrors.

The logical function of the ECL circuit of FIG. 1a in response to inputs A and its complement $\overline{A}$ and B and its complement B is illustrated in Table A for an enabled circuit. Transistors are indicated by their corresponding numbers. Output OUT is taken from the collector of transistor 32 and the complement of output OUT, $\overline{OUT}$, is taken from the collector of transistor 34. The on (ON) or off (OFF) states of each transistor shown in FIG. 1a is illustrated in table A. Note that "HI" refers to a logic high value for an input while "LO" refers to a logic low value for an input.

FIG. 1c illustrates transfer curves of the sum of currents through the circuit of FIG. 1a versus the voltage at enable input EN for the circuit of FIG. 1a. This current equals the current through resistors 7, 17, 23, 25 and 27 of FIG. 1a. A curve is drawn in FIG. 1c corresponding to the various nominal threshold voltages (the nominal threshold voltage value throughout herein is for example 0.5 volts and all threshold voltage values are expressed relative to a nominal threshold voltage value) of the n-channel transistors in the circuit of FIG. 1a, as labeled for each curve shown. For the graphs shown in FIG. 1c, circuit ground is considered as −3.3 volts and Vcc is considered as 0 volts. Note the sharp peaks (labeled a, b, and c) in the wave characteristics. These sharp peaks occur during voltage transitions at enable input EN shown in FIG. 1a. These sharp peaks are due to crow bar current through inverters 9 and 11. Crow bar current is the transient leakage current which occurs simultaneously between source to drain through the p-channel and n-channel transistors of an inverter. The voltage change at the input of an inverter is not instantaneous and therefore there is a short period of time during the voltage transition at the gates of the inverter transistors (inverter input) in which both inverter transistors are turned on. Crow bar current through an inverter is undesirable, and the existence of crow bar current manifests itself in the sharp peaks shown in FIG. 1c. A low power standby mode is observed for the circuit of FIG. 1a by observing the low current and low voltage characteristics near zero milliamps for the graphs shown in FIG. 1c.

FIG. 1d illustrates transfer curves of load resistor voltage swing for a load resistor (13, 15, 19, or 21) of one of the emitter coupled pairs as a function of voltage at enable input EN for the circuit of FIG. 1a. Since substantially the same current is mirrored in the circuit of FIG. 1a, resistor 13, 15, 19 or 21 is representative of the load resistor. Each transfer curve is shown according to a nominal threshold voltage level for the n-channel transistors of FIG. 1a. For the graphs shown in FIG. 1c, Vcc is 0 volts and circuit ground is −3.3 volts. Noise margin indicates the amount of input voltage change tolerated before a change occurs at the output of a circuit. The voltage swing across a load resistor of one of the emitter coupled pairs is representative of the voltage change at the circuit output (OUT and $\overline{OUT}$) distinguished by one base-emitter voltage drop since the same mirrored current value flows through the load resistors and since the load resistors are preferably of the same value. FIG. 1d indicates a noise margin of approximately −1.5 volts with respect to Vcc or 0 volts and a noise margin of 0.8 with respect to circuit ground or −3.3 volts. Although the current to voltage characteristic, as shown in FIG. 1c, of this circuit is poor, the noise margin is adequate. Hence, the circuit of FIG. 1a responds quickly (as demonstrated in FIG. 1d by the nearly vertical slope of the curves between 0 volts and −0.18 volts of the load resistor swing) to changes in the enable input voltage.

SUMMARY OF THE INVENTION

A circuit is provided which comprises a reference voltage sub-circuit operable to generate a reference voltage and at least one current mirror operable to receive the reference voltage generated by the reference voltage sub-circuit. The reference voltage sub-circuit includes a bipolar transistor and a field effect transistor. The field effect transistor is connected at a first drain/source to a first terminal of the bipolar transistor and it is connected at a second drain/source to a second terminal of the bipolar transistor. The gate of the field effect transistor is operable to receive a signal capable of enabling the circuit.

BRIEF DESCRIPTION OF THE DRAWINGS

FIG. 1c illustrates transfer curves of the sum of currents through the circuit of FIG. 1a versus the voltage at enable input EN for the circuit of FIG. 1a.

FIG. 1d illustrates transfer curves of load resistor voltage swing for a load resistor of one of the emitter coupled pairs as a function of voltage at enable input EN for the circuit of FIG. 1a.

FIG. 2b illustrates transfer curves of the sum of currents through the circuit of FIG. 2a versus the voltage at enable input EN for the circuit of FIG. 2a.

FIG. 2c illustrates transfer curves of load resistor voltage swing for a load resistor of one of the emitter coupled pairs as a function of voltage at enable input EN for the circuit of FIG. 2a.

FIG. 3b illustrates transfer curves of the sum of currents through the circuit of FIG. 3a versus the voltage at enable input EN for the circuit of FIG. 3a.

FIG. 3c illustrates transfer curves of load resistor voltage swing for a load resistor (13, 15, 19, or 21) of one of the emitter coupled pairs as a function of voltage at enable input EN for the circuit of FIG. 3a.

Figure 1A:
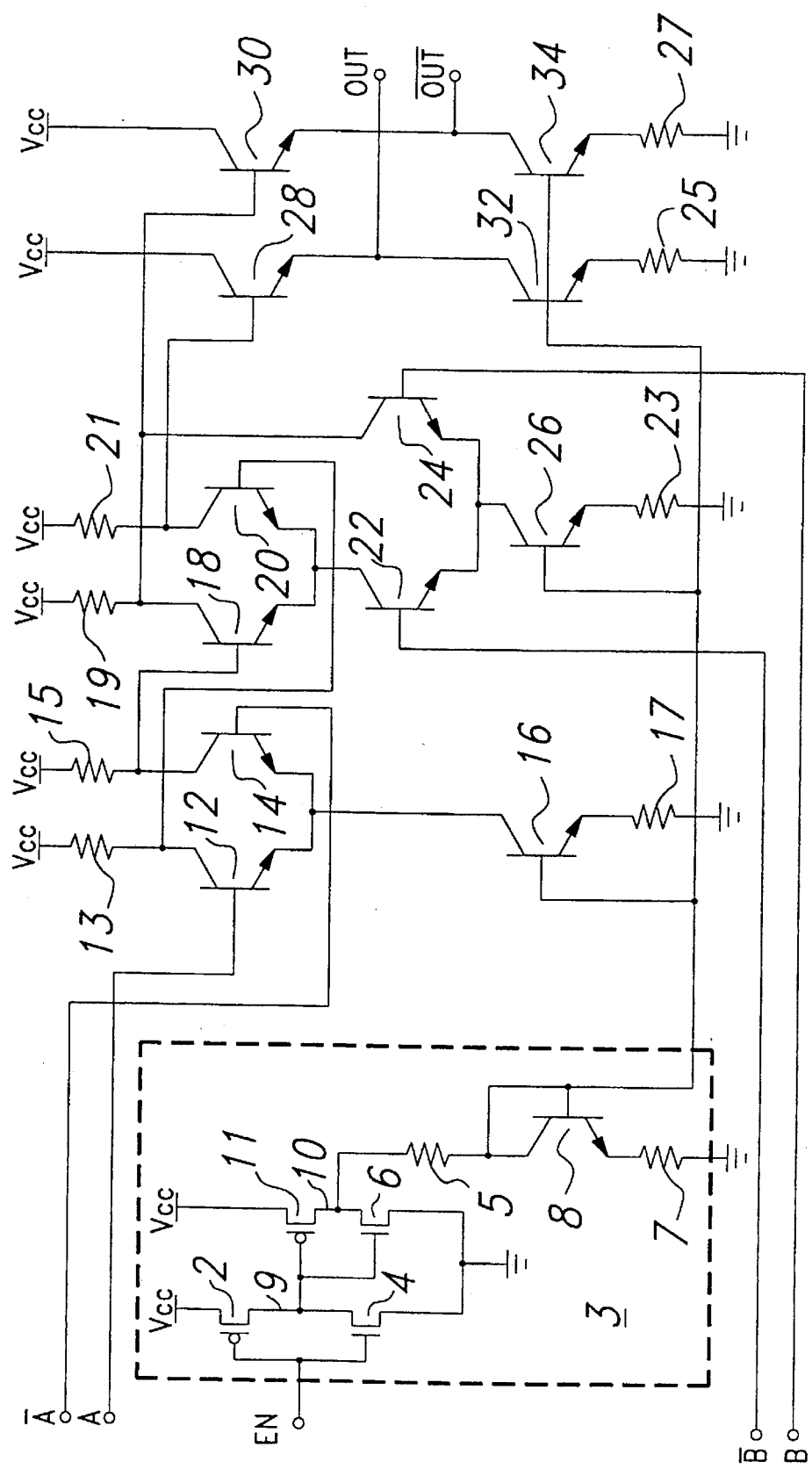
FIG. 1a illustrates a schematic drawing of a prior art ECL circuit implementing a logic OR gate.

Reference numerals have been carried forward.

DETAILED DESCRIPTION OF THE INVENTION

Figure 2B:
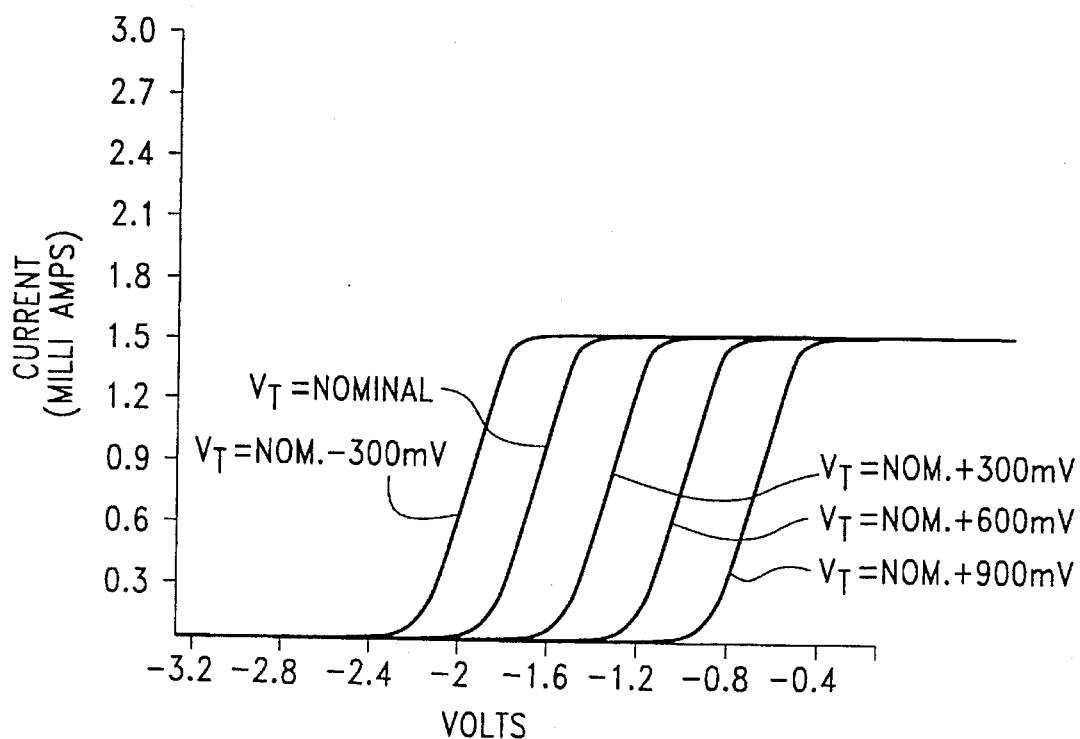
Figure 2A:
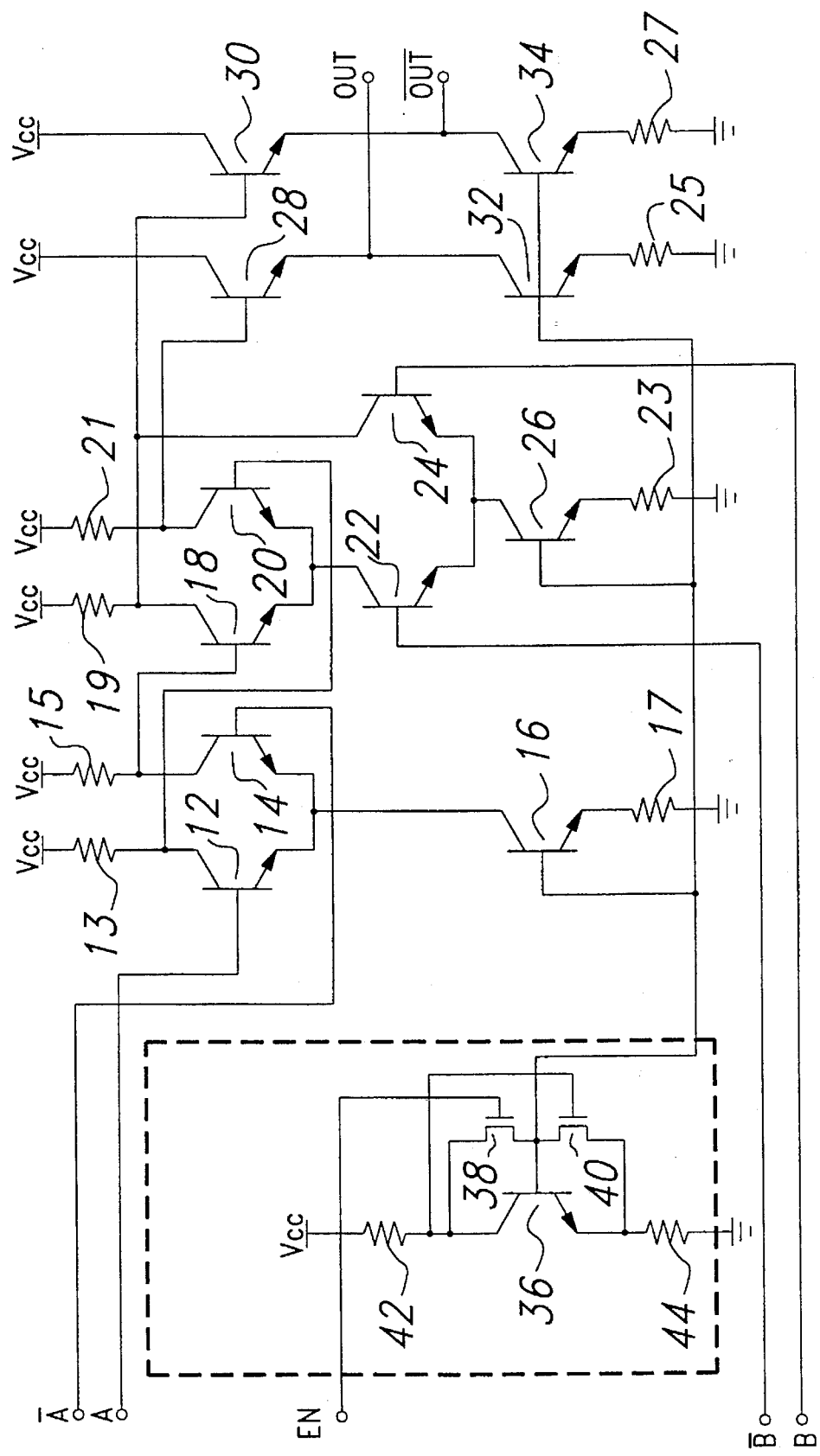
FIG. 2a shows an embodiment of the invention which illustrates a schematic drawing of an ECL circuit that implements a logic OR gate.

FIG. 2a shows an embodiment of the invention which illustrates a schematic drawing of an ECL circuit that implements a logic OR gate. In comparison with the prior art

TABLE A

| EN | A | $\overline{A}$ | B | $\overline{B}$ | OUT | $\overline{OUT}$ | 2 | 4 | 6 | 8 | 10 | 12 | 14 |
|----|---|----|---|----|-----|------|---|---|---|---|----|----|----|
| HI | HI | LO | HI | LO | HI | LO | OFF | ON | ON | OFF | ON | ON | OFF |
| HI | LO | HI | HI | LO | HI | LO | OFF | ON | ON | OFF | ON | OFF | ON |
| HI | LO | HI | LO | HI | HI | LO | OFF | ON | ON | OFF | ON | OFF | ON |
| HI | HI | LO | LO | HI | HI | LO | OFF | ON | ON | OFF | ON | ON | OFF |

| 16 | 18 | 20 | 22 | 24 | 26 | 28 | 30 | 32 | 34 |
|----|----|----|----|----|----|----|----|----|----|
| ON | OFF | OFF | OFF | ON | ON | ON | OFF | ON | ON |
| ON | OFF | OFF | OFF | ON | ON | ON | OFF | ON | ON |
| ON | OFF | ON | ON | OFF | ON | OFF | ON | ON | ON |
| ON | ON | OFF | ON | OFF | ON | ON | OFF | ON | ON | circuit of FIG. 1a, rather than gating the source of current from inverters 9 and 11, the provider of the mirrored current, is gated. Therefore, the conduction of current from local reference sub-circuit 3 is stopped by depriving transistor 36 of its base current. This is done by shutting transistor 38 off. In order to avoid a floating node at the base of transistor 36, transistor 40 is added to latch the base of transistor 36 to ground. Thus, when transistor 38 is turned off transistor 40 stays on long enough to pull the base of transistor 36 down to circuit ground. Preferably, transistor 40 has an aspect ratio (gate length to gate width) of 2/20. The logic function of the circuit of FIG. 2a is shown in Table B.

The invention shown in FIG. 2a has an advantage over the prior art in that in its NMOS configuration a PMOS transistor (which generally is the type of p-channel transistor used) is not present in the local reference sub-circuit. Therefore a semiconductor controlled rectifier (SCR) which has a p-diffusion connected to voltage Vcc is not present in the local reference sub-circuit. Another advantage of the invention over the prior art is that much less area is required to fabricate the circuit of FIG. 2a as an integrated circuit than that of FIG. 1a.

Figure 1B:
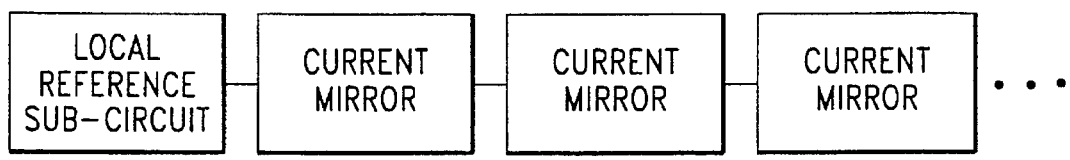
FIG. 1b illustrates a block diagram drawing of the local reference sub-circuit scheme wherein a local reference sub-circuit is connected to several current mirrors.

FIG. 2b illustrates transfer curves of the sum of currents through the circuit of FIG. 2a versus the voltage at enable input EN for the circuit of FIG. 2a. This current sum equals the sum of the currents through resistor 7, 17, 23, 25 and 27 of FIG. 2a. A curve is drawn in FIG. 2b corresponding to the various nominal threshold voltages of the n-channel transistors in the circuit of FIG. 2a, as labeled for each curve shown. For the graphs shown in FIG. 2b, circuit ground is considered as −3.3 volts and Vcc is considered as 0 volts. Note that less current is present during turn-on for the circuit shown in FIG. 2a as in comparison with the circuit in FIG. 1a as demonstrated by a comparison of FIG. 2b with FIG. 1b. Thus noise on the ECL enable signal will not substantially generate power supply current transients on the ECL differential power supply to be used with the circuit of FIG. 2a. Consequently, there are no sharp peaks, indicative of crow bar current like that shown in FIG. 1b. Also note the sensitivity to nMOS threshold voltages of the circuit as shown in FIG. 2b as compared with that shown in FIG. 1b. Note the low standby power usuage as demonstrated by the graphs of FIG. 2b. There is virtually no current for logic low enable voltages (i.e. near circuit ground).

Figure 1C:
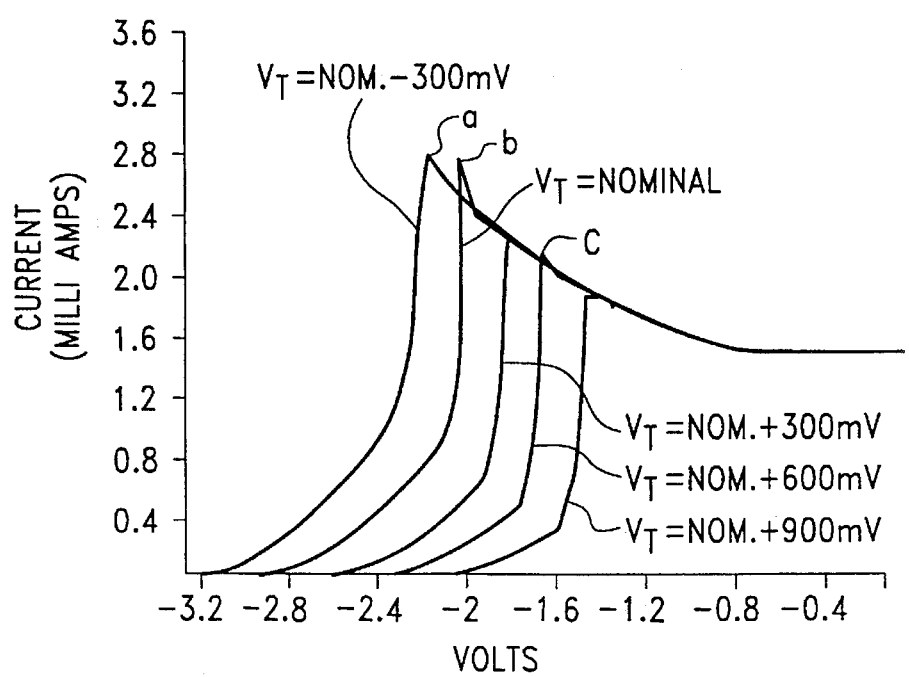
Figure 1D:
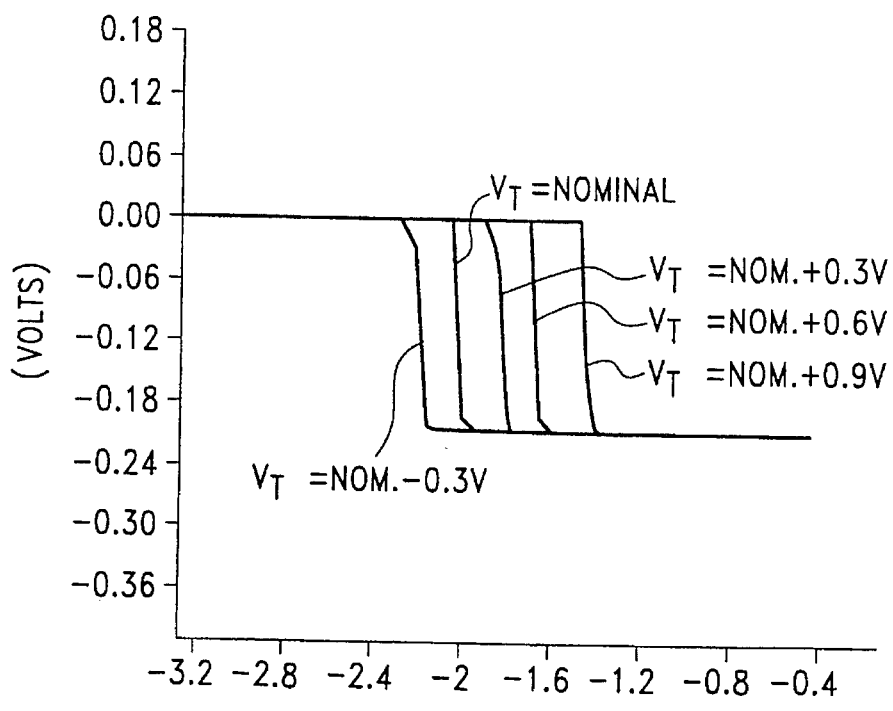
Figure 2C:
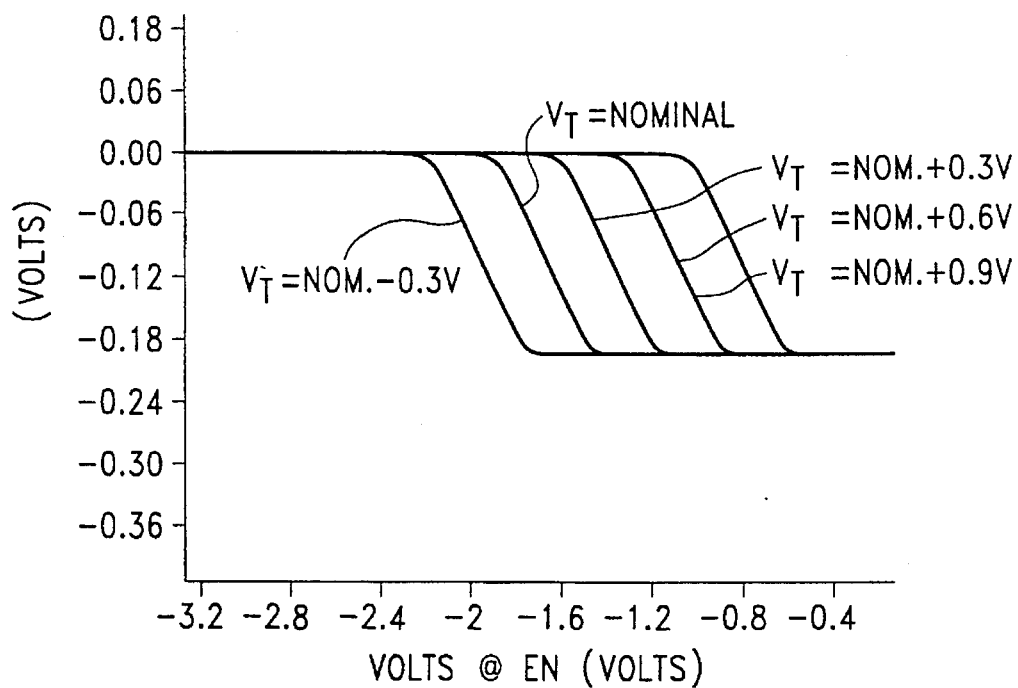

FIG. 2c illustrates transfer curves of load resistor voltage swing for a load resistor (13, 15, 19, or 21) of one of the emitter coupled pairs as a function of voltage at enable input EN for the circuit of FIG. 2a. Since the substantially the same current is mirrored in the circuit of FIG. 2a, resistor 13, 15, 19 or 21 is representative of the load resistor. Each transfer curve is shown according to a nominal threshold voltage level for the n-channel transistors of FIG. 2a. For the graphs shown in FIG. 2c, Vcc is 0 volts and circuit ground is −3.3 volts. As with the transfer curves shown in FIG. 1c, the transfer curves in FIG. 2c indicate that the output voltage swing at nominal threshold voltage is not sensitive to small fluctuations in enable input EN voltage. For instance, for even a 300 millivolt deviation, a one volt noise margin is present. However, in comparison of these transfer curves with those of FIG. 1c, the noise margin with respect to circuit ground and the noise margin with respect to Vcc of FIG. 2c is not quite as good as that shown in FIG. 1c. The slope of the curves in FIG. 2c during transition are not as steep as those of the curves in FIG. 1c, thereby indicating less independence from noise on enable input EN for the circuit in FIG. 2a than the circuit in FIG. 1a.

Figure 3B:
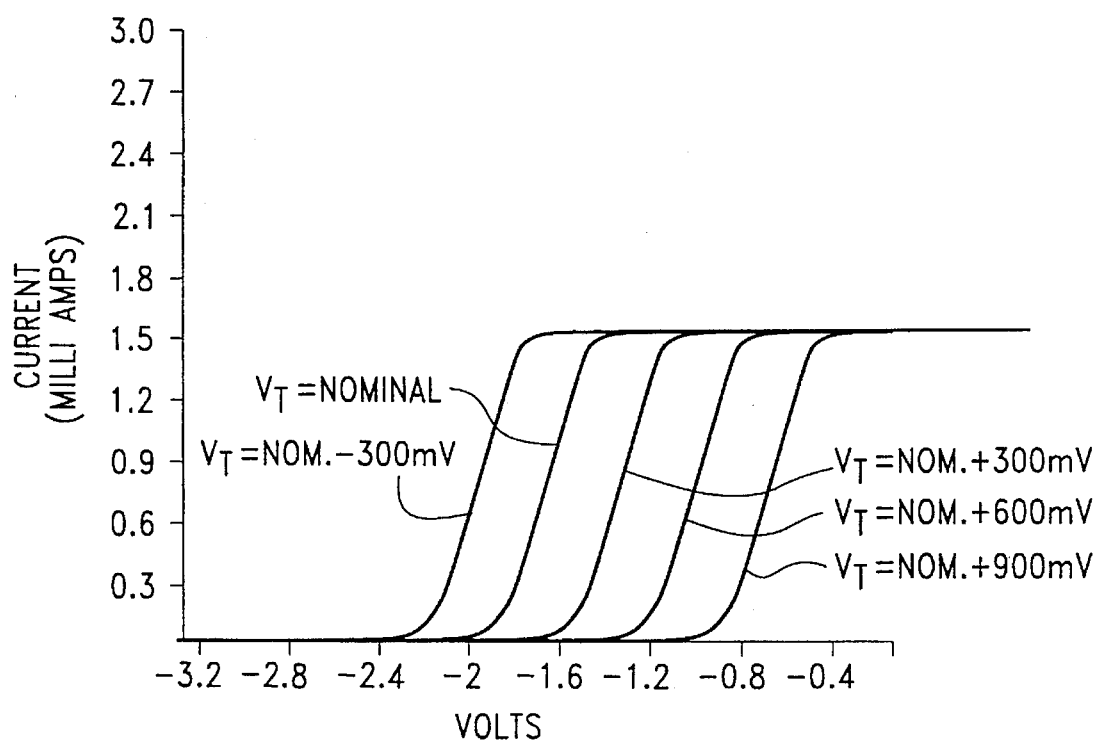
Figure 3A:
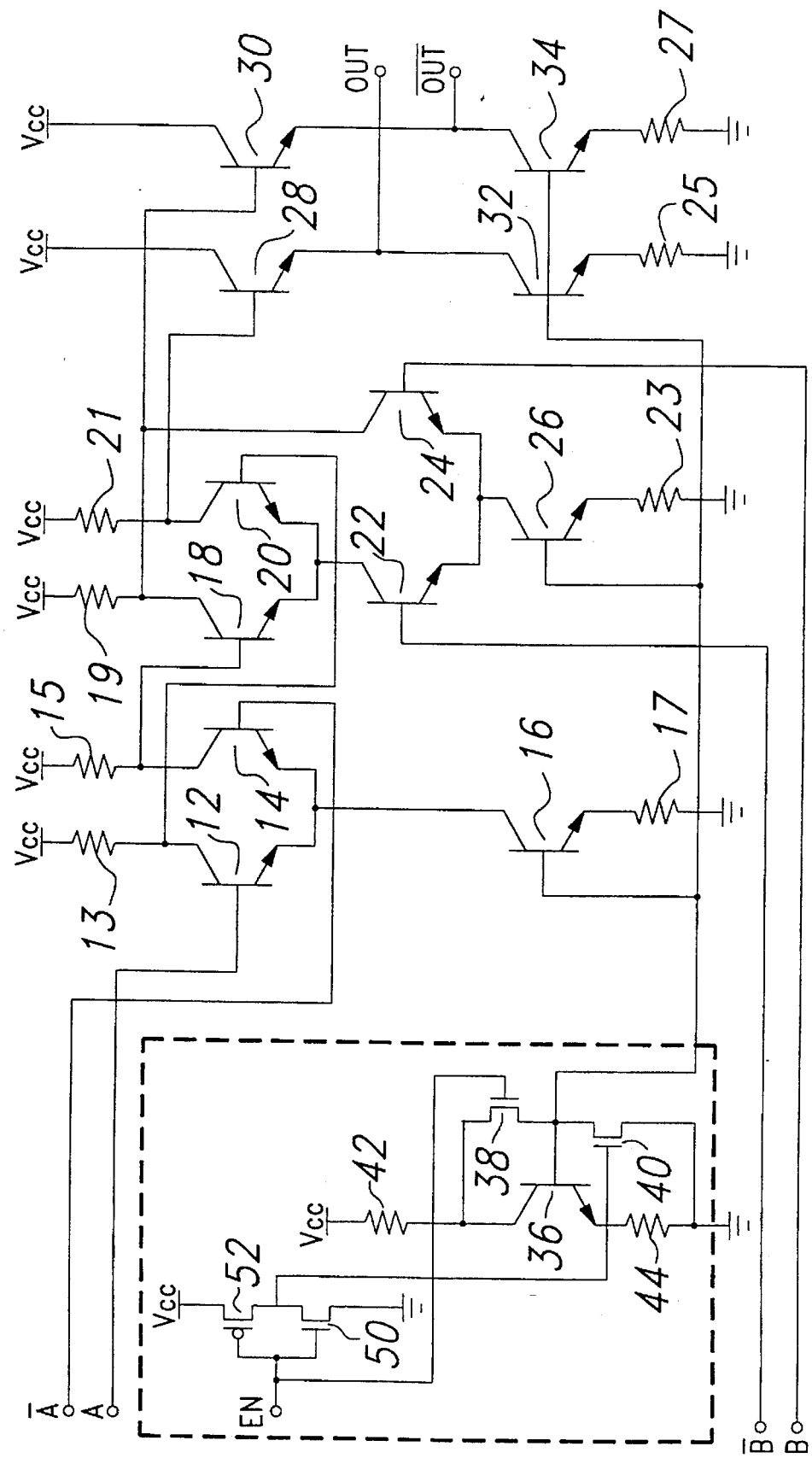
FIG. 3a shows a schematic drawing of local reference sub-circuit 3 connected to circuitry operable to perform logic OR operations on inputs A, $\overline{A}$, B and $\overline{B}$.

The preferred embodiment of the invention is illustrated in FIG. 3a. FIG. 3a shows a schematic drawing of local reference sub-circuit 3 connected to circuitry operable to perform logic OR operations on inputs A, $\overline{A}$, B and $\overline{B}$. The gate of transistor 40 is connected to the output of inverter 48 comprising n-channel transistor 50 and p-channel transistor 52. The gate of transistor 38 is connected to the input of inverter 48 and the gate of transistor 40 is connected to the output of inverter 48. Transistor 40 serves to discharge the base of transistor 36 during logic low enable signals at input EN. For high performance applications (greater current), transistor 36 is fabricated as a double side base and the emitter area of transistor 36 is typically equal to substantially 3.6 $\mu m^2$. Note that although a p-channel transistor is used in FIG. 3a (transistor 52), this transistor is of a relatively small gate width in comparison with transistor 11 of FIG. 1a. Transistor 11 of FIG. 1a must have a wide gate width due to the fact that it furnishes collector current to transistor 8. Whereas the wider transistor 11 is, the better it approximates a low resistance path, no such concern is needed for transistor 52 since no p-channel transistor is used in the path from Vcc to the collector of transistor 36.

The logic function of the circuit shown in FIG. 3a is shown in Table C.

FIG. 3b illustrates transfer curves of the sum of currents through the circuit of FIG. 3a versus the voltage at enable input EN for the circuit of FIG. 3a. This current sum equals the sum of the currents through resistors 7, 17, 23, 25 and 27 of FIG. 3a. FIG. 3b like FIG. 2b does not have the sharp peaks indicative of crow bar current, as does FIG. 1b, due to a lower amount current during circuit turn-on. Note also that low power is exhibited in the standby mode of the circuit of FIG. 3a (i.e. logic low enable input EN where logic low is around −3.3 volts and logic high is around 0.0 volts).

Figure 3C:
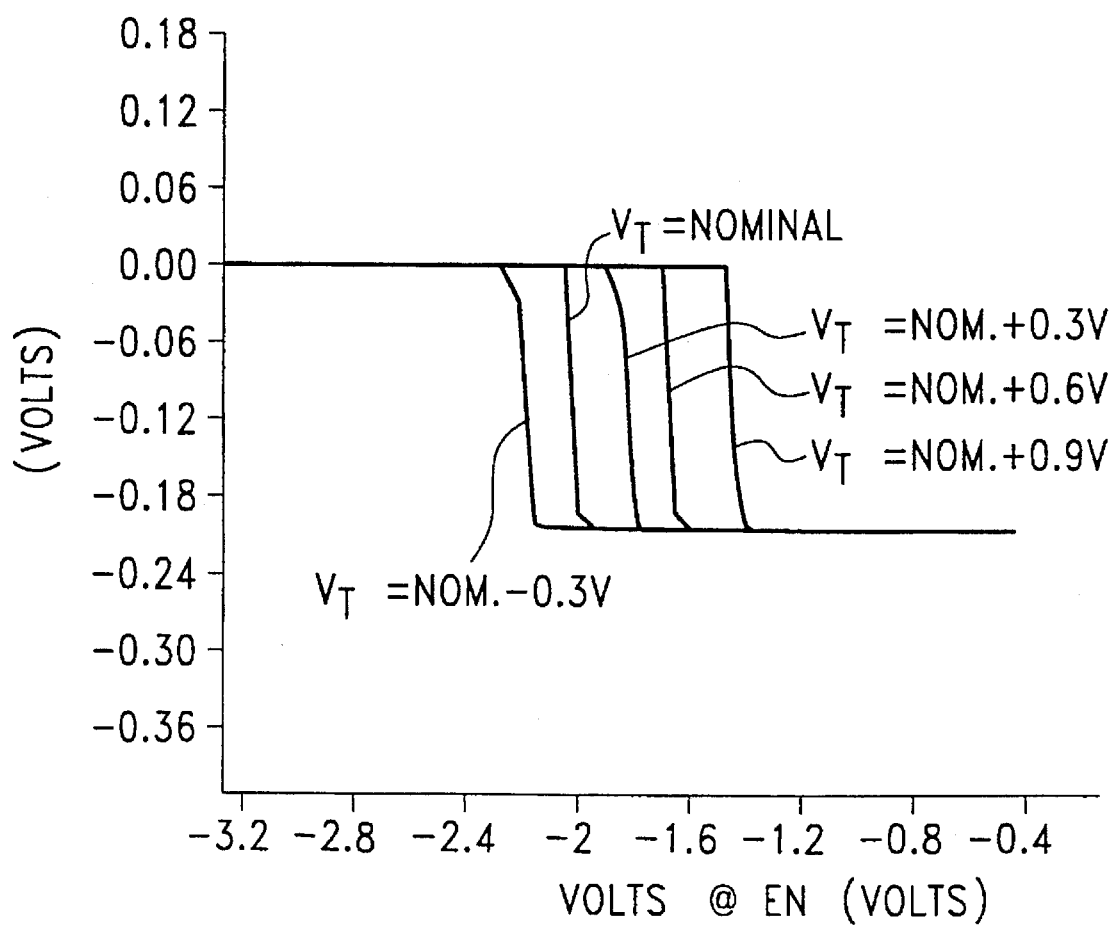

The circuit of FIG. 3a additionally provides improved noise margin. FIG. 3c illustrates transfer curves of load

TABLE B

| EN | A | $\overline{A}$ | B | $\overline{B}$ | OUT | $\overline{OUT}$ | 36 | 38 | 40 | 12 | 14 | 16 |
|----|----|----|----|----|----|----|----|----|----|----|----|----|
| HI | HI | LO | HI | LO | HI | LO | ON | ON | ON | ON | OFF | ON |
| HI | LO | HI | HI | LO | HI | LO | ON | ON | ON | OFF | ON | ON |
| HI | LO | HI | LO | HI | LO | HI | ON | ON | ON | OFF | ON | ON |
| HI | HI | LO | LO | HI | HI | LO | ON | ON | ON | ON | OFF | ON |

| 18 | 20 | 22 | 24 | 26 | 28 | 30 | 32 | 34 |
|----|----|----|----|----|----|----|----|----|
| OFF | OFF | OFF | ON | ON | ON | OFF | ON | ON |
| OFF | OFF | OFF | ON | ON | ON | OFF | ON | ON |
| OFF | ON | ON | OFF | ON | OFF | ON | ON | ON |
| ON | OFF | ON | OFF | ON | ON | OFF | ON | ON | resistor voltage swing for a load resistor (13, 15, 19, or 21) of one of the emitter coupled pairs as a function of voltage at enable input EN for the circuit of FIG. 3a. This embodiment also has a very steep transfer characteristic and therefore it allows a much higher noise margin.

Although the invention has been described in detail herein with reference to preferred embodiments and certain described alternatives, it is to be understood that this description is by way of example only, and it is not to be construed in a limiting sense. It is to be further understood that numerous changes in the details of the embodiments of the invention, and additional embodiments of the invention, will be apparent to, and may be made by, persons of ordinary skill in the art having reference to this description. For instance, p-channel transistors can be consistently substituted for n-channel transistors and p-type bipolar transistors can be consistently substituted or n-type bipolar transistors. Further, the reference voltage sub-circuit can be used with circuitry operable to implement other logic functions such as AND, NAND, OR, or NOR and a combination thereof. It is contemplated that all such changes and additional embodiments are within the-spirit and true scope of the invention as claimed below.

TABLE C

| EN | A | $\bar{A}$ | B | $\bar{B}$ | OUT | $\overline{OUT}$ | 52 | 50 | 38 | 40 | 36 | 12 | 14 |
|----|---|---|---|---|-----|-----|----|----|----|----|----|----|----|
| HI | HI | LO | HI | LO | HI  | LO  | OFF | ON | ON | OFF | ON | ON | OFF |
| HI | LO | HI | HI | LO | HI  | LO  | OFF | ON | ON | OFF | ON | OFF | ON |
| HI | LO | HI | LO | HI | LO  | HI  | OFF | ON | ON | OFF | ON | OFF | ON |
| HI | HI | LO | LO | HI | HI  | LO  | OFF | ON | ON | OFF | ON | ON | OFF |

|  |  |  |  |  | 16 | 18 | 20 | 22 | 24 | 26 | 28 | 30 | 32 | 34 |
|--|--|--|--|--|----|----|----|----|----|----|----|----|----|----|
|  |  |  |  |  | ON | OFF | OFF | OFF | ON | ON | ON | OFF | ON | ON |
|  |  |  |  |  | ON | OFF | OFF | OFF | ON | ON | ON | OFF | ON | ON |
|  |  |  |  |  | ON | OFF | ON | ON | OFF | ON | OFF | ON | ON | ON |
|  |  |  |  |  | ON | ON | OFF | ON | OFF | ON | ON | OFF | ON | ON |

I claim:

1. A circuit comprising:
   a reference voltage sub-circuit operable to generate a reference voltage on an output line; and
   at least one current mirror operable to receive said reference voltage, said reference voltage sub-circuit including a bipolar transistor whose base is connected to said output line and a first field effect transistor, said first field effect transistor being connected at a first drain/source to a first terminal of said bipolar transistor and being connected at a second drain/source to a second terminal of said bipolar transistor, the gate of said first field effect transistor being operable to receive a signal capable of enabling said circuit.

2. A circuit as recited in claim 1 which further comprises an inverter wherein said inverter is operable to receive at its input, said signal capable of enabling said circuit.

3. A circuit as recited in claim 1 wherein a second field effect transistor is connected to said second terminal and a third terminal of said bipolar transistor.

4. A circuit as recited in claim 2 wherein a second field effect transistor is connected to said second terminal and a third terminal of said bipolar transistor.

5. A circuit as recited in claim 2 wherein said inverter comprises an n-channel transistor connected to a p-channel transistor.

6. A circuit operable to perform emitter-coupled logic operations including the circuit recited in claim 1, said operations consisting of OR, NOR, AND, or NAND or a combination thereof.

7. A circuit operable to perform emitter-coupled logic operations including the circuit recited in claim 2, said operations consisting of OR, NOR, AND, or NAND or a combination thereof.

8. A circuit operable to perform emitter-coupled logic operations including the circuit recited in claim 3, said operations consisting of OR, NOR, AND, or NAND or a combination thereof.

9. A circuit operable to perform emitter-coupled logic operations including the circuit recited in claim 4, said operations consisting of OR, NOR, AND, or NAND or a combination thereof.

10. A circuit comprising:
    a reference voltage sub-circuit operable to generate a reference voltage on an output line; and
    at least one current mirror operable to receive said reference voltage, said reference voltage sub-circuit including a bipolar transistor whose base is connected to said output line and a first field effect transistor, said first field effect transistor being connected at a first drain/source to a first terminal of said bipolar transistor and being connected at a second drain/source to a second terminal of said bipolar transistor, the gate of said first field effect transistor being operable to receive a signal capable of enabling said circuit; and
    circuitry to perform logic connected to said reference voltage sub-circuit.

11. A circuit as recited in claim 10 wherein said logic is selected from the group consisting of OR, NOR, AND, or NAND or a combination thereof.

12. A circuit comprising:
    a reference voltage sub-circuit operable to generate a reference voltage on an output line; and
    at least one current mirror operable to receive said reference voltage, said reference voltage sub-circuit including a bipolar transistor whose base is connected to said output line and a first field effect transistor, said first field effect transistor being connected at a first drain/source to a first terminal of said bipolar transistor and being connected at a second drain/source to a second terminal of said bipolar transistor, the gate of said first field effect transistor being operable to receive a signal capable of enabling said circuit;
    an inverter wherein said inverter is operable to receive at its input, said signal capable of enabling said circuit; and
    circuitry to perform logic connected to said reference voltage sub-circuit.

13. A circuit as recited in claim 12 wherein said logic is selected from the group consisting of OR, NOR, AND, or NAND or a combination thereof.

* * * * *